(12) United States Patent
Hoheisel et al.

(10) Patent No.: US 6,680,652 B2
(45) Date of Patent: Jan. 20, 2004

(54) LOAD SWITCHING FOR TRANSMISSIONS WITH DIFFERENT PEAK-TO-AVERAGE POWER RATIOS

(75) Inventors: Kevin Hoheisel, Hiawatha, IA (US); Richard Hohneke, Cedar Rapids, IA (US); Rohan Houlden, Cedar Rapids, IA (US); Neal Mains, Marion, IA (US); Stephen Oglesby, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/922,676

(22) Filed: Aug. 6, 2001

(65) Prior Publication Data
US 2003/0025561 A1 Feb. 6, 2003

(51) Int. Cl.[7] .................................................. H03F 3/04
(52) U.S. Cl. ........................ 330/302; 330/284; 330/305
(58) Field of Search ................................. 330/284, 302, 330/305; 455/74

(56) References Cited

U.S. PATENT DOCUMENTS

| | | | |
|---|---|---|---|
| 3,883,815 A | * 5/1975 | Grundy | 330/21 |
| 4,342,968 A | 8/1982 | Ritter | 330/295 |
| 5,060,294 A | 10/1991 | Schwent et al. | 455/93 |
| 5,233,309 A | * 8/1993 | Spitalny et al. | 330/84 |
| 5,276,912 A | 1/1994 | Siwiak et al. | 455/73 |
| 5,361,403 A | 11/1994 | Dent | 455/74 |
| 5,392,464 A | 2/1995 | Pakonen | 455/115 |
| 5,423,074 A | 6/1995 | Dent | 455/74 |
| 5,541,554 A | 7/1996 | Stengel et al. | 330/51 |
| 5,543,756 A | 8/1996 | Anderson | 333/186 |
| 5,661,434 A | 8/1997 | Brozovich et al. | 330/51 |
| 5,774,017 A | 6/1998 | Adar | 330/51 |
| 5,834,975 A | 11/1998 | Bartlett et al. | 330/278 |
| 5,872,481 A | 2/1999 | Sevic et al. | 330/51 |
| 5,939,941 A | 8/1999 | Nair et al. | 330/251 |
| 5,973,557 A | 10/1999 | Miyaji et al. | 330/51 |
| 6,023,611 A | 2/2000 | Bolin et al. | 455/114 |
| 6,069,526 A | 5/2000 | Ballantyne | 330/51 |
| 6,078,210 A | * 6/2000 | Uchida et al. | 327/530 |
| 6,091,966 A | 7/2000 | Meadows | 455/553 |
| 6,111,459 A | 8/2000 | Nishijima et al. | 330/51 |
| 6,118,989 A | 9/2000 | Abe et al. | 455/127 |
| 6,127,886 A | 10/2000 | Khabbaz et al. | 330/51 |

* cited by examiner

*Primary Examiner*—Henry Choe
(74) *Attorney, Agent, or Firm*—Withrow & Terranova, PLLC (57) ABSTRACT

The present invention relates to controlling load impedance during wireless communications to maintain amplifier linearity for transmissions, such as voice and high-speed data, having significantly different peak-to-average power ratios. At a desired output power, a first load impedance is selected for transmissions having a first peak-to-average power ratio and a second load impedance is selected for transmissions having a second peak-to-average power ratio, in order to ensure that appropriate amplifier linearity is achieved for both voice and high-speed data transmissions. Preferably, amplifier efficiency is optimized for transmissions having the first and second peak-to-average power ratios. Changing the effective load impedance may be effected by providing a first impedance network and switching a second impedance network in association with the first impedance network.

27 Claims, 6 Drawing Sheets

LOAD SWITCHING FOR TRANSMISSIONS WITH DIFFERENT PEAK-TO-AVERAGE POWER RATIOS

FIELD OF THE INVENTION

The present invention relates to transmitting data, and in particular to controlling the load impedance for an amplifier based on the peak-to-average power ratio associated with the data being transmitted.

BACKGROUND OF THE INVENTION

Mobile terminals, such as wireless telephones, have traditionally transmitted voice or data at very low data rates with an emphasis on optimizing the power added efficiency (PAE). Existing personal communication services (PCS) systems are typically required to communicate using two or more standards. These standards often include communicating using a type of analog frequency modulation (FM) in one mode and a type of amplitude modulation (AM) in another.

Traditionally, the maximum power output requirements for each mode have been different for these dual mode systems. In order to optimize efficiency, load-switching techniques have been used to change the effective load impedance for power amplifiers when operating at the different power levels of the respective modes.

The new Third Generation (3G) code division multiple access (CDMA) PCS system referred to as cdma2000 uses a form of phase shift keying (PSK) modulation for the transmission of both voice and data. Depending on the information content and the rate of transmission, cdma2000 mobile terminals transmit signals of significantly different peak-to-average power ratios at a given output power. For example, voice data typically has a lower peak-to-average power ratio than control information or data signals. In addition, the power amplifier of the mobile terminal is required to meet a certain linearity specification for all signals.

Since the cdma2000 standard is new, PAE and linearity issues for signals of differing peak-to-average power ratios in PCS systems have just surfaced. A power amplifier meeting the linearity requirements for the highest peak-to-average power ratio signal specified has lower PAE for all other signals having a lower peak-to-average power ratio. This lower PAE results in reduced talk time. In addition, power amplifier reliability can be jeopardized by the internal heat generated by the lower PAE for those signals. Conversely, a power amplifier configured to efficiently transmit a signal with lower peak-to-average power ratio cannot meet the requisite linearity to transmit high-speed data.

When optimizing the power amplifier's linearity for transmitting signals with a higher peak-to-average power, such as data, the power amplifier's PAE in voice mode (or lower peak-to-average power ratio) is degraded. Given $P=V^2/R_L$, where $R_L$ represents an overall load impedance, and given that the battery voltage (V) for the mobile terminal cannot increase, $R_L$ needs to decrease to meet linearity requirements for the greater peak-to-average power ratio. By lowering $R_L$, the effective saturation power (Psat) of the amplifier is raised, allowing the amplification of signals with a higher peak-to-average power ratio with requisite linearity. Further, the lower $R_L$ will not be optimum in PAE for voice transmission, due to the device operating backed off from the optimum point near $P_{SAT}$.

One technique for measuring linearity of a CDMA power amplifier is to determine the Adjacent Channel Power Ratio (ACPR), which is a measure of the distortion that the power amplifier introduces into an ideal signal. ACPR also determines the amount of interference caused to neighboring channels by power leaking into the adjacent spectrum. These requirements ensure that the transmitted waveform will suffer minimal distortion due to non-linearties in the transmitter channel.

In order to maximize system channel capacity, all wireless standards set limits on adjacent channel leakage. In general, ACPR is determined by:

1) Measuring the average total output at $f_C$ within a $f_{BW}$ bandwidth ($P_{TOTAL}$), where $f_C$ is the radio frequency (RF) carrier frequency and $f_{BW}$ is the bandwidth of the modulated carrier as defined by the particular system;

2) Measuring power at $\pm f_1$ offset frequency in a $f_{BW1}$ bandwidth ($PACP_1$), wherein $ACPR_1$ is defined as: $ACPR_1=PACP_1-P_{TOTAL}$ (dBc), where $f_{BW1}$ is the bandwidth defined to measure power in at this offset; and 3) Measuring power at $\pm f_2$ offset frequency in a $f_{BW2}$ bandwidth ($PACP_2$), wherein $ACPR_2$ is defined as: $ACPR_2=PACP_2-P_{TOTAL}$ (dBc) where $f_{BW2}$ is the bandwidth to defined measure power in at this offset.

More offsets can be specified depending upon the system. Cdma2000 ACPR or linearity requirements are the same regardless of the resultant peak-to-average power ratio, which may greatly vary for both voice data and high-speed data. Since linearity cannot be compromised, the cdma2000 maximum power output requirements for transmitting for modes having a peak-to-average power ratio above a certain level have been lowered in an attempt to meet the linearity requirements for these modes, while maintaining PAE at full power in modes with lower peak-to-average power ratios, such as voice mode. The disadvantage of transmitting control information and high-speed data at a lower output power level is that the range of the mobile terminal is decreased. As the mobile terminal is located further away from a base station, the mobile terminal may be able to communicate in voice mode, but not in certain data modes. Such disparity between voice and high-speed data services is undesirable.

In essence, the rigid linearity requirements are forcing designers to compromise either efficiency for lower peak-to-average power ratio signals or communication range for higher peak-to-average power ratio transmissions, and vice versa. As such, there is a need for a technique to optimize efficiency for transmissions with different peak-to-power ratios, such as those for voice and high-speed data transmissions, while meeting linearity requirements in an economical fashion. There is a further need to provide such operation within a given power level or operating mode.

SUMMARY OF THE INVENTION

The present invention relates to controlling load impedance during wireless communications to maintain amplifier linearity for transmissions, such as voice and high-speed data, having significantly different peak-to-average power ratios. At a desired output power, a first load impedance is selected for transmissions having a first peak-to-average power ratio and a second load impedance is selected for transmissions having a second peak-to-average power ratio, in order to ensure that appropriate amplifier linearity is achieved for both voice and high-speed data transmissions. Preferably, amplifier efficiency is optimized for transmissions having the first and second peak-to-average power ratios. Changing the effective load impedance may be effected by providing a first impedance network and switching a second impedance network in association with the first impedance network.

In one embodiment, a switchable impedance network is provided having a first impedance network for transmissions having the first peak-to-average power ratio and a second impedance network, which is switched in parallel with the first impedance network, for transmissions having the second peak-to-average power ratio. The second impedance network is effectively removed from the transmission path during transmissions having the first peak-to-average power ratio and reduces the overall load impedance during transmissions having the second peak-to-average power ratio.

Control of the switchable impedance network is typically provided by a control system using switching circuitry to switch impedance elements into and out of the transmission path. The switching circuitry may take many forms, including switching transistors and PIN diodes.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to controlling an amplifier's load impedance during wireless communications in order to maintain the amplifier's linearity for transmissions having peak-to-average power ratios differing sufficiently to adversely affect linearity. At a desired output power, a first load impedance is selected for a first type of transmission having a lower peak-to-average power ratio, and a second load impedance is selected for a second type of transmission having a higher peak-to-average power ratio, in order to ensure that appropriate amplifier linearity is achieved for both transmissions. Preferably, amplifier efficiency is optimized for both types of transmissions. The relative terms "lower" and "higher" modifying "peak-to-average power ratio" are used to differentiate between ranges or levels in which linearity is compromised to a defined extent.

Typically, voice data and lower speed data result in relatively lower peak-to-average power ratios, wherein higher speed data and certain control signals result in higher peak-to-average power ratios, as is appreciated by those skilled in the art. For conciseness and readability, the following description uses voice data to represent an exemplary transmission resulting in a lower peak-to-average power ratio and high-speed data to represent an exemplary transmission resulting in a higher peak-to-average ratio. The use of the terms voice data and high-speed data in no way limits the scope of the invention to voice and high-speed data applications or impedance switching based solely thereon.

Figure 1:
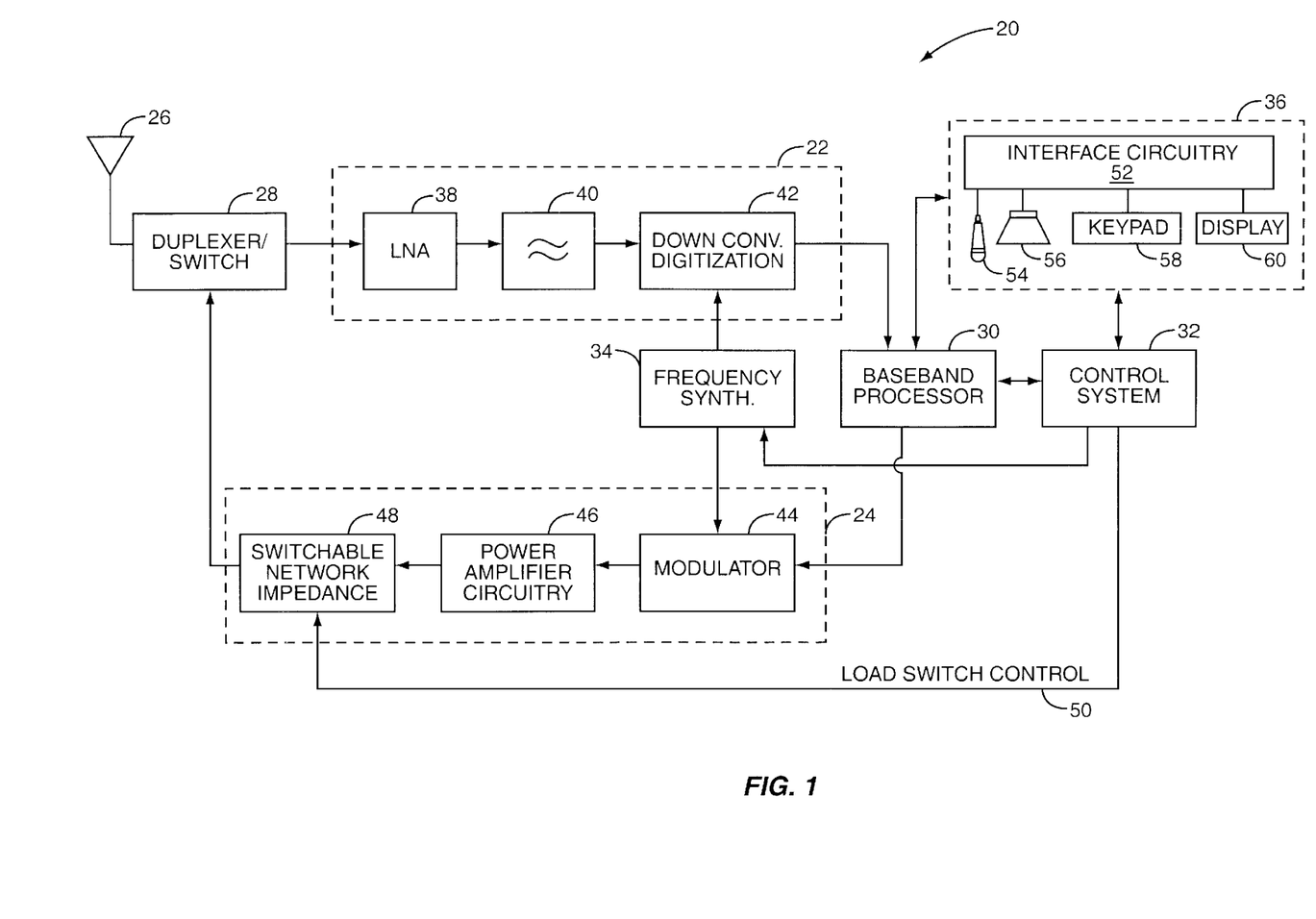
FIG. 1 is schematic representation of a mobile terminal configured according to one embodiment of the present invention.

The present invention is preferably incorporated in a mobile terminal 20, such a mobile telephone, personal digital assistant, or the like. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 38 amplifies the signal. A filter circuit 40 minimizes broadband interference in the received signal, while downconversion and digitization circuitry 42 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission from the antenna 26.

The amplified signal is sent to the switch 28 and antenna 26 through switchable impedance network 48, which is configured to set the overall load impedance for the amplifier circuitry 46 to optimize values based on the type or speed of information being transmitted. Typically, the switch 28 and antenna 26 provide a relatively constant load impedance, which is combined with the impedance of the switchable impedance network 48 to establish an overall load impedance for the amplifier circuitry 46. A load switch control signal 50 is provided by the control system 32 to select an impedance, which will vary depending on the relative peak-to-average power ratio associated with the data being transmitted. The structure and operation of the switchable impedance network 48 is provided in greater detail below.

A user may interact with the mobile terminal 20 via the interface 36, which may include interface circuitry 52 associated with a microphone 54, a speaker 56, a keypad 58, and a display 60. The interface circuitry 52 typically includes analog-to-digital converters, digital-to-analog converters, amplifiers, and the like. Additionally, it may include a voice encoder/decoder, in which case it may communicate directly with the baseband processor 30.

The microphone 54 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 56 by the I/O and interface circuitry 52. The keypad 58 and display 60 enable the user to interact with the mobile terminal 20, input numbers to be dialed, address book information, or the like, as well as monitor call progress information.

Figure 2:
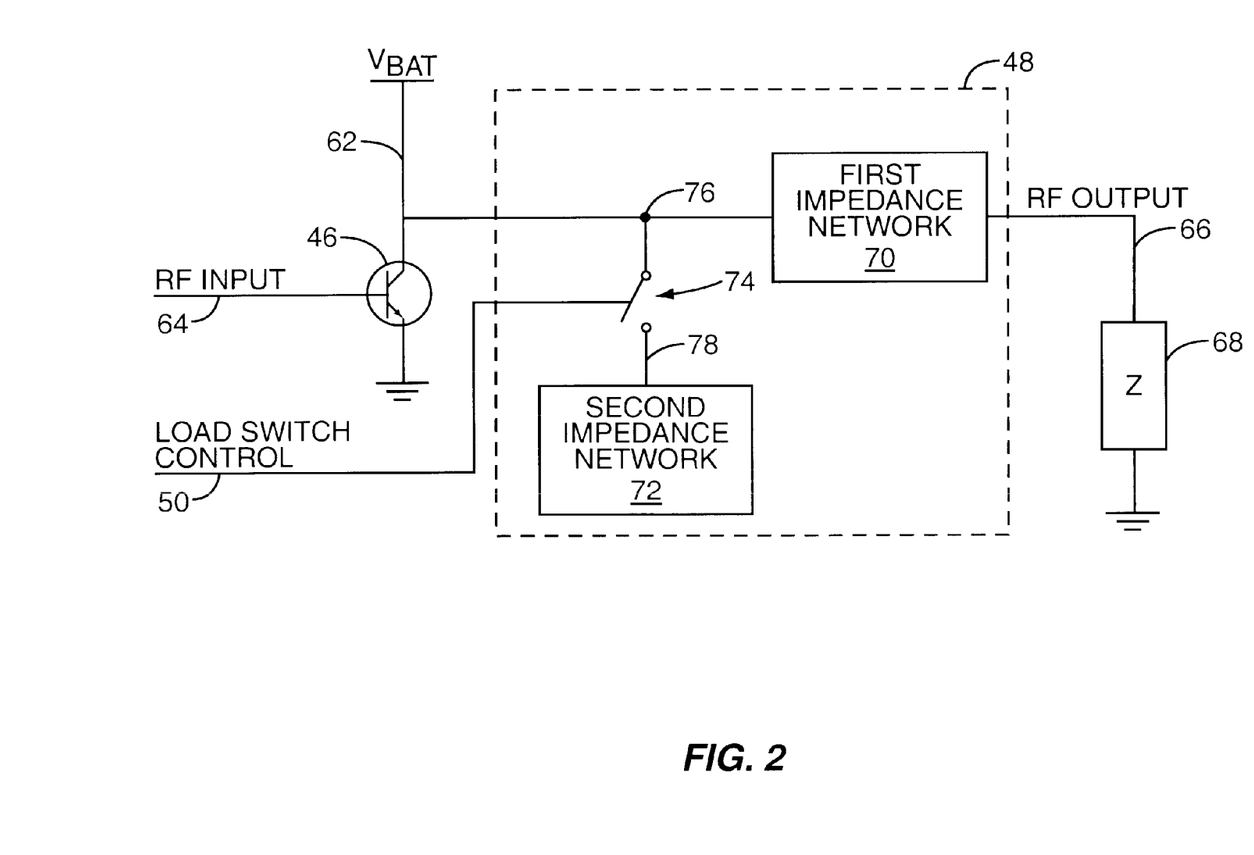
FIG. 2 is a schematic representation of amplifier and impedance matching networks according to one embodiment of the present invention.

A high-level schematic representation of one embodiment of the present invention is illustrated in FIG. 2. Power is provided to the mobile terminal 20, including the amplifier circuitry 46 and load impedance circuitry 48, through a power supply represented by a voltage, $V_{BAT}$ 62. A bipolar transistor represents the amplifier circuitry 46, which will typically include multiple amplifier stages using several bipolar or field effect transistors (FETs) and a corresponding bias network. The transistors comprising the amplifier circuitry 46 are preferably gallium arsenide, heterojunction bipolar transistors (HBT) manufactured by R F Micro Devices, 7628 Thorndike Road, Greensboro, N.C. 27409. Other transistor technologies will also benefit from the present invention.

The amplifier circuitry 46 will amplify a radio frequency (RF) input signal 64 modulated with data representing voice, data, or control information using any number of modulation techniques and provide an RF output signal 66 to a load impedance 68 via the switchable impedance network 48. The load impedance 68 is relatively fixed and represents existing impedances imposed by elements along the final part of the transmission path, such as the switch 28 and antenna 26.

The switchable impedance network 48 will preferably include a first impedance network 70 and a second impedance network 72. As illustrated, the first impedance network 70 remains in the transmission path and will affect all transmissions. The second impedance network 72 is coupled to the transmission path via switching circuitry 74, which is capable of selectively coupling the second impedance network 72 in and out of the transmission path. In operation, a node 76 along the transmission path is coupled to a node 78 of the second impedance network 72 when the switching circuitry 74 is biased to create a short circuit between nodes 76 and 78. The load impedance switch control signal 50, which is typically provided by the control system 32, is used to selectively control the switching circuitry 74 based on the peak-to-average power ratio associated with the transmitted data. For example, the impedance may be controlled based whether voice or high-speed data is being transmitted, because the respective lower and higher peak to average power ratios associated therewith.

In essence, the first and second impedance networks 70 and 72 of the switchable impedance network 48 are configured to cooperate to provide different overall load impedances for voice and high-speed data transmissions. The different load impedances are configured to maintain linearity of the amplifier circuitry 46 when amplifying the RF input signal 64 with voice and high-speed data, respectively. Those skilled in the art will recognize various techniques for selectively changing the effective load impedance.

In the preferred embodiments, the second impedance network 72 is switched into the transmission path in parallel with the first impedance network 70. Alternatively, more elaborate switching techniques may be used to alternate between impedance networks or to change values of components within an impedance network corresponding to transmitting data resulting in lower or higher peak-to-average power ratios, such as those associated with voice and high-speed data. The embodiments disclosed herein are believed to be most economical and to provide the best mode for practicing the invention.

The switching circuitry 74 may include any type of switching components, such as transistors configured in a switching mode or positive-intrinsic-negative (PIN) diodes. Examples of each are provided in greater detail below.

By selecting different load impedances, optimized total load impedances for different peak-to-average power ratios can be achieved. Therefore the linearity (ACPR) performance in both voice and high-speed data can meet the 3G standards, while the power amplifier is optimally transmitting at a selected or full output power. By having the capability of transmitting signals having significantly different peak-to-average power ratios, the range of the mobile terminal 20 can be maximized for a given amplifier configuration. As such, the control system 32 may control the total load impedance based on whether voice or high-speed data is being transmitted using the load switch control signal 50. The control system 32 may also control output power levels and the like in traditional fashion. Notably, voice and high-speed data can be transmitted at or within any given output power level with the present invention. At any given power, a change in the total load impedance will substantially compensate for signal characteristics adversely affecting power, linearity, and/or efficiency. Preferably, amplifier efficiency is optimized for both types of transmissions.

Figure 3:
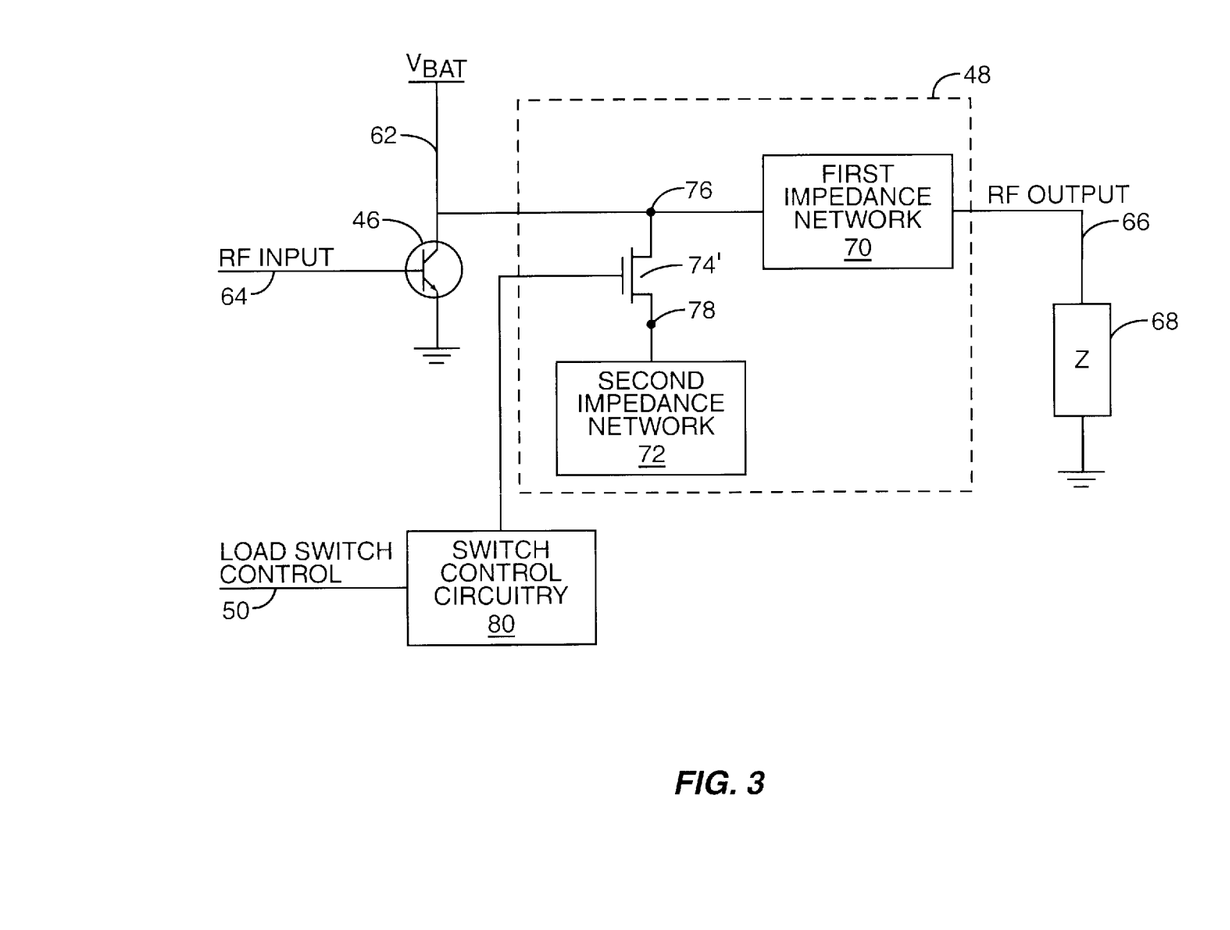
FIG. 3 is a schematic representation of amplifier and impedance matching networks according to a first specific embodiment of the circuitry represented in FIG. 2.

The embodiment in FIG. 3 incorporates a field effect transistor (FET) 74' as the switching circuitry 74. The FET 74' is driven by switch control circuitry 80 that receives the load switch control signal 50 from the control system 32. The switch control circuitry 80 is configured to process the load switch control signal 50 and provide a signal to the gate of the FET 74' to turn the FET 74' on or off. When on, the FET 74' will effectively connect nodes 76 and 78 to place the second impedance network 72 in parallel with the first impedance network 70. The parallel combination of the first and second impedance networks 70 and 72 is configured to allow linear operation of the amplifier circuitry 46 during transmission of high-speed data, while optimizing amplifier efficiency.

When off, the FET 74' will provide a high impedance or open-circuit condition, removing the second impedance network 72 from the transmission path. The first impedance network 70 is configured to allow linear operation of the amplifier circuitry 46 during transmission of voice, while optimizing amplifier efficiency.

Figure 4:
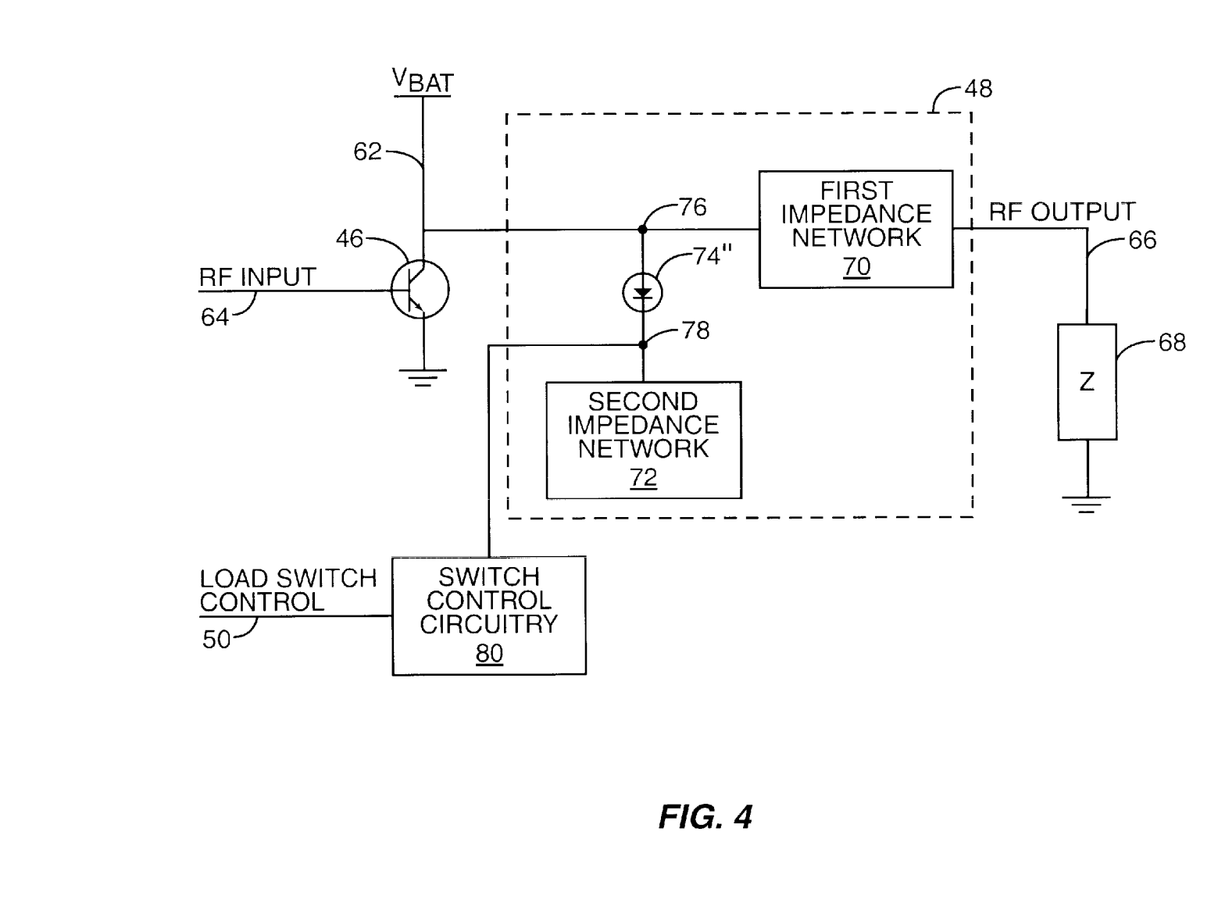
FIG. 4 is a schematic representation of amplifier and impedance matching networks according to a second specific embodiment of the circuitry represented in FIG. 2.

The embodiment illustrated in FIG. 4 incorporates a PIN diode 74" as the switching circuitry 74. The PIN diode 74" is driven by the switch control circuitry 80 that receives the load switch control signal 50 from the control system 32.

The load switch control circuitry 80 is configured to process the switch control signal 50 and provide a bias signal to node 78 to turn PIN diode 74" on or off. When on, the PIN diode 74" will effectively connect nodes 76 and 78 to place the second impedance network 72 in parallel with the first impedance network 70. The parallel combination of the first and second impedance networks 70 and 72 is configured to allow linear operation of the amplifier circuitry 46 during transmission of high-speed data, while optimizing amplifier efficiency.

When off, the PIN diode 74" will provide a high impedance or open-circuit condition, removing the second impedance network 72 from the transmission path. The first impedance network 70 is configured to allow linear operation of the amplifier circuitry 46 during transmission of voice while optimizing amplifier efficiency.

Figure 5:
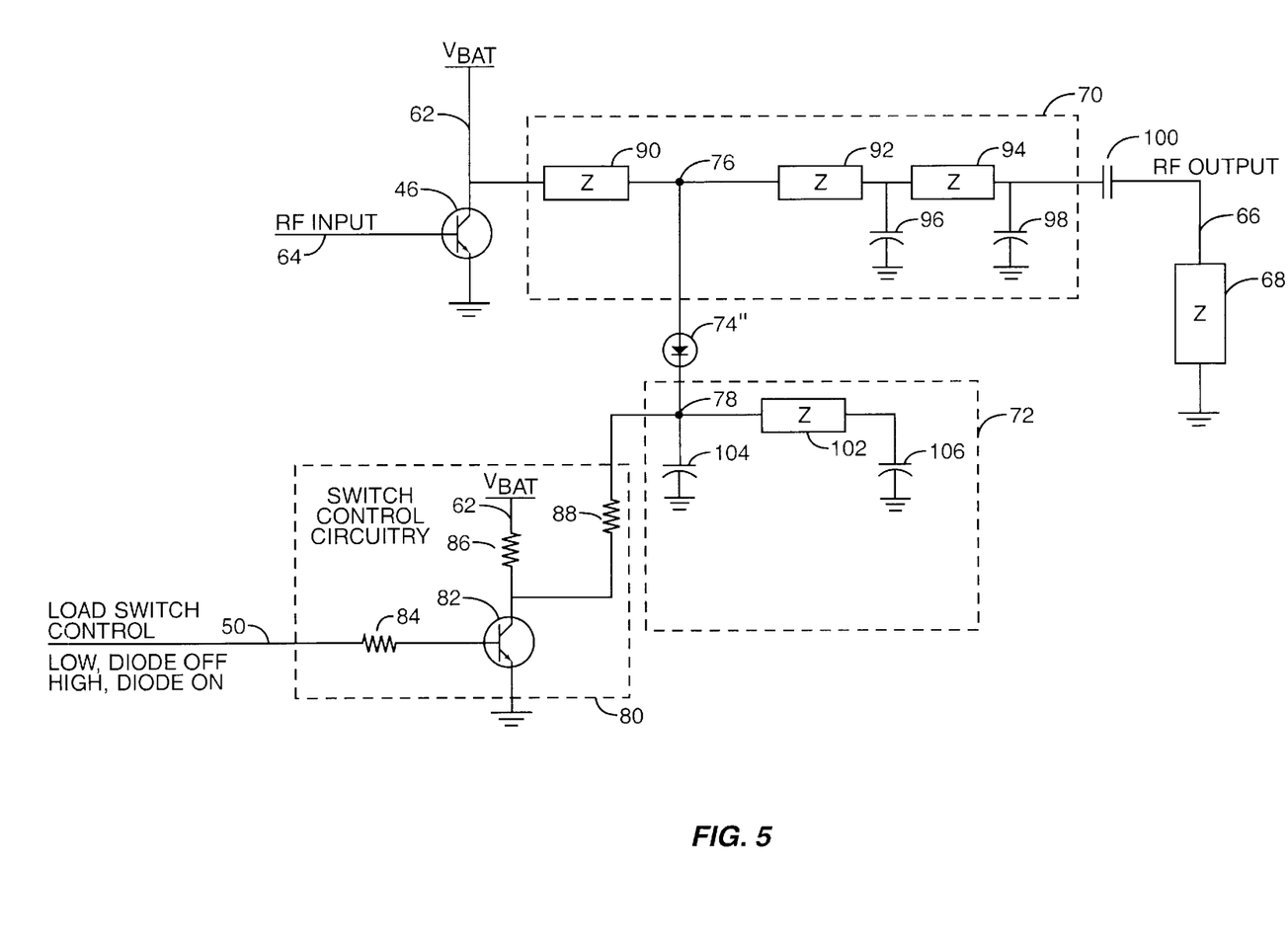
FIG. 5 is a schematic representation of a first exemplary configuration for the amplifier and impedance matching networks according to the embodiment represented in FIG. 4.

Further details for the switch control circuitry 80 and the first and second impedance networks 70 and 72 are provided in FIG. 5. To bias the PIN diode 74" on, node 78 needs to be at a potential voltage lower than that of node 76. Depending on the PIN diode 74", node 76 should typically have a voltage potential of more than 1.0 volt greater than node 78 to ensure that the PIN diode 74" stays properly biased. Since node 76 is connected to $V_{BAT}$ 62 through impedance 90, node 78 needs to be at a voltage potential less than $V_{BAT}$ 62.

To bias the PIN diode 74" off, node 78 needs to be at a similar or higher voltage than $V_{BAT}$ 62. Similarly to ensure that the PIN diode 74" is biased on, a greater that 1.0 volt potential between nodes 76 and 78 should be maintained when biasing the PIN diode 74" to an off state. When biased to an off state, the PIN diode 74" provides a very high impedance. If either the anode or cathode is presented a high impedance, no current will flow through the PIN diode 74"

There are numerous techniques for providing bias for the PIN diode 74". As illustrated in FIG. 5, the switch control circuitry 80 includes an NPN bipolar transistor 82, which receives base drive from the load switch control signal 50 through base resistor 84. The collector of transistor 82 is coupled to $V_{BAT}$ 62 through resistor 86 and to node 78 through resistor 88. When the load switch control signal 50 is high, current will flow through base resistor 84 to turn on transistor 82. Accordingly, the collector of transistor 82 pulls node 78 low through resistor 82 to bias the PIN diode 74" to an on state. Using typical HBT technology, a voltage greater than 1.3 volts is required to turn on transistor 82. When the load switch control signal 50 is low, the transistor 82 is off and the collector is pulled high via resistor 86. As such, node 78 is pulled high, which biases the PIN diode 74" in an off state.

When biased on, the PIN diode 74" will couple the second impedance network 72 in parallel with the first impedance network 70. The second impedance network 72 is depicted as including a passive component network, including impedance element 102 and capacitors 104 and 106. The first impedance network 70 includes impedance elements 90, 92, and 94 and capacitors 96 and 98. An output coupling capacitor 100 may be provided in the transmission path prior to the remaining load impedance 68. The impedance element 68 may be inductive, capacitive, resistive or a combination thereof.

Figure 6:
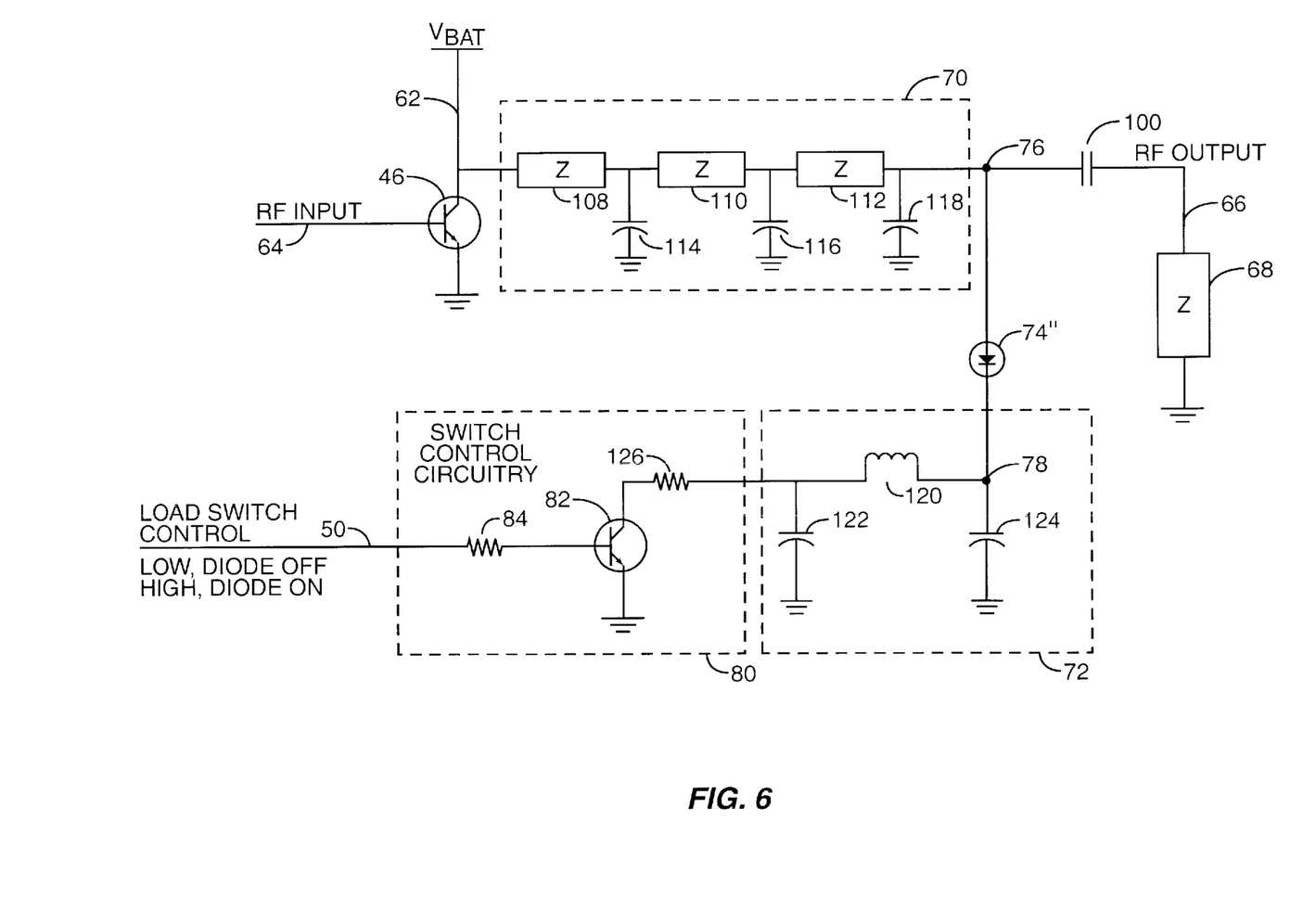
FIG. 6 is a schematic representation of a second exemplary configuration for the amplifier and impedance matching networks according to the embodiment represented in FIG. 4.

An alternative exemplary configuration is illustrated in FIG. 6, wherein the first impedance network 70 is primarily located along the transmission path between the amplifier circuitry 46 and node 76. The first impedance network 70 includes impedance elements 108, 110, and 112 in series with shunt capacitors 114, 116, and 118 forming a desired resultant load impedance for a modulated RF output signal carrying voice information. The second impedance network 72 includes a series inductor 120 and shunt capacitors 122 and 124 providing a first impedance, which when placed in parallel with the impedance of the first impedance network 72 (and the load impedance 68) forms a desired resultant load for a modulated RF output signal carrying high-speed data.

The collector of transistor 82 is coupled to the impedance network through resistor 126. When the load switch control signal 50 is high, the transistor 82 will turn on and cause current to flow through the PIN diode 74", inductor 120, and resistor 126. When the load switch control signal 50 is low, the collector of transistor 82 will provide a high impedance, and the PIN diode 74" will not conduct. Accordingly, the second impedance network 72 will be isolated from the transmission path and first impedance network 70.

Those skilled in the art will recognize improvements and modifications to the preferred embodiments of the present invention. As noted above, the present invention controls the load impedance of an amplifier based on peak-to-average power ratios. These ratios may be provided, measured, or anticipated based on the type of data being transmitted. Further, the lower and upper peak-to-average power ratios define ranges or be associated with values greater or less than predefined limits. Although only two impedance settings were described in detail, the impedance network may be configured to support three, four, or more settings to support a corresponding number of peak-to-average value ranges. All such improvements and modifications are considered within the scope of the concepts disclosed herein and the claims that follow.

What is claimed is:

1. A circuit comprising:
   a) a power amplifier for amplifying a radio frequency signal to provide an amplified radio frequency signal having one of a first peak-to-average power ratio and a second peak-to-average power ratio; and
   b) a switchable impedance network operating on the amplified radio frequency signal and cooperating with an existing load impedance to provide an overall load impedance selectable between a first load impedance when the amplified radio frequency signal has the first peak-to-power ratio and a second load impedance when the amplified radio frequency signal has the second peak-to-average power ratio, wherein the first and second load impedances facilitate a defined linearity for the power amplifier for the first and second peak-to-average ratios for a given output power level.

2. The circuit of claim 1 wherein the first and second load impedances are further adapted to optimize efficiency while maintaining the defined linearity for the power amplifier when the amplified signal has the first or second peak-to-average power ratios.

3. The circuit of claim 1 wherein the first and second peak-to-average power ratios correspond to voice and data transmissions, respectively.

4. The circuit of claim 1 wherein the first peak-to-average power ratio is a lower peak-to-average ratio relative the second peak-to-average power ratio, which is a higher peak-to-average power ratio.

5. The circuit of claim 1 wherein the switchable impedance network is responsive to a load switch control signal to select the first load impedance when the amplified radio frequency signal has the first peak-to-power ratio and the second load impedance when the amplified radio frequency signal has the second peak-to-average power ratio.

6. The circuit of claim 5 wherein the switchable impedance network comprises a first impedance network to effect the first load impedance and a second impedance network selectively switched into parallel with the first impedance network using the load switch control signal to effect the second load impedance, which is a function of the first and second impedance networks.

7. The circuit of claim 6 wherein the second impedance network is switched in parallel with the first impedance network with switching circuitry responsive to the load switch control signal.

8. The circuit of claim 7 wherein the switching circuitry is a transistor coupling the first and second impedance networks.

9. The circuit of claim 7 wherein the switching circuitry is a PIN diode coupling the first and second impedance networks.

10. The circuit of claim 7 further comprising switch control circuitry associated with the switching circuitry and adapted to receive the load switch control signal and control the switching circuitry to selectively switch the second impedance network in parallel with the first impedance network.

11. The circuit of claim 5 further comprising a control system adapted to control transmissions having the first or second peak-to-average power ratios and provide the load switch control signal to select the first load impedance for transmissions having the first peak-to-average power ratio and the second load impedance for the second peak-to-average power ratio.

12. A circuit comprising:
   a) a power amplifier for amplifying a radio frequency signal to provide an amplified radio frequency signal having one of a first peak-to-average power ratio and a second peak-to-average power ratio;
   b) a first impedance network associated with the power amplifier to receive the amplified radio frequency signal, the first impedance network having a first impedance configured to maintain a defined linearity for the power amplifier at a given output power for transmissions having a first peak-to-average power ratio; and
   c) a second impedance network selectively coupled to the first impedance network during transmissions having a second peak-to-average power ratio, the second impedance network and first impedance network cooperating to provide a second impedance configured to maintain the defined linearity for the power amplifier at the given output power for the transmissions having the second peak-to-average ratio.

13. The circuit of claim 12 further comprising switching circuitry coupling the first and second impedance networks and adapted to couple the second impedance network to the first impedance network during the transmissions having the second peak-to-average power ratio and isolate the second impedance network from the first impedance network during the transmissions having the first peak-to-average power ratio.

14. The circuit of claim 13 wherein the switching circuitry is a transistor configured to selectively couple the first and second impedance networks.

15. The circuit of claim 13 wherein the switching circuitry is a PIN diode configured to selectively couple the first and second impedance networks.

16. The circuit of claim 13 wherein the switching circuitry is responsive to a load switch control signal to selectively couple the second impedance network to the first impedance network.

17. The circuit of claim 12 further comprising switching means coupling the first and second impedance networks and adapted to couple the second impedance network to the first impedance network during the transmission having the second peak-to-average power ratio and isolate the second impedance network from the first impedance network during the transmission having the first peak-to-average power ratio.

18. The circuit of claim 12 wherein the first and second load impedances are further adapted to optimize efficiency while maintaining the defined linearity for the power amplifier for transmission having the first or second peak-to-average power ratios.

19. The circuit of claim 12 wherein the first and second peak-to-average power ratios correspond to voice and data transmissions, respectively.

20. The circuit of claim 12 wherein the first peak-to-average power ratio is a lower peak-to-average ratio relative the second peak-to-average power ratio, which is a higher peak-to-average power ratio.

21. A mobile terminal comprising:
   a) a control system configured to generate a load switch control signal indicative of transmissions having either a first peak-to-average ratio or a second peak-to-average power ratio;
   b) a power amplifier for amplifying a radio frequency signal to provide an amplified radio frequency signal having one of a first peak-to-average power ratio and a second peak-to-average power ratio;
   c) a first impedance network associated with the power amplifier to receive the amplified radio frequency signal, the first impedance network having a first impedance configured to maintain a defined linearity for the power amplifier at a given output power for transmissions having the first peak-to-average power ratio; and
   d) a second impedance network selectively coupled to the first impedance network during transmissions having the second peak-to-average power ratio, the second impedance network and first impedance network cooperating to provide a second impedance configured to maintain the defined linearity for the power amplifier at the given output power for the transmissions having the second peak-to-average ratio; and
   e) switching circuitry coupling the first and second impedance networks and adapted to couple the second impedance network to the first impedance network during the transmission having the second peak-to-average power ratio and isolate the second impedance network from the first impedance network during the transmissions having the first peak-to-average power ratio in response to the load switch control signal.

22. The mobile terminal of claim 21 wherein the switching circuitry is a transistor configured to selectively couple the first and second impedance networks.

23. The mobile terminal of claim 21 wherein the switching circuitry is a PIN diode configured to selectively couple the first and second impedance networks.

24. The mobile terminal of claim 21 wherein the first and second load impedances are further adapted to optimize efficiency while maintaining the defined linearity for the power amplifier for the transmissions having the first or second peak-to-average power ratios.

25. The mobile terminal of claim 21 wherein the first and second peak-to-average power ratios correspond to voice and data transmissions, respectively.

26. The mobile terminal of claim 21 wherein the first peak-to-average power ratio is a lower peak-to-average ratio relative the second peak-to-average power ratio, which is a higher peak-to-average power ratio.

27. The mobile terminal of claim 21 wherein the power amplifier comprises a plurality of stages including gallium arsenide heterojunction bipolar transistors.

* * * * *